(12) United States Patent
Lee

(10) Patent No.: US 11,065,723 B2
(45) Date of Patent: Jul. 20, 2021

(54) LASER ETCHING APPARATUS AND A METHOD OF LASER ETCHING USING THE SAME

(71) Applicant: SAMSUNG DISPLAY CO., LTD., Yongin-si (KR)

(72) Inventor: Dong-Hoon Lee, Asan-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 471 days.

(21) Appl. No.: 15/472,418

(22) Filed: Mar. 29, 2017

(65) Prior Publication Data
US 2017/0304951 A1    Oct. 26, 2017

(30) Foreign Application Priority Data
Apr. 20, 2016    (KR) .................. 10-2016-0047963

(51) Int. Cl.
| | |
|---|---|
| *B23K 26/70* | (2014.01) |
| *B23K 26/359* | (2014.01) |
| *B23K 26/352* | (2014.01) |
| *B23K 26/066* | (2014.01) |
| *B23K 26/361* | (2014.01) |

(Continued)

(52) U.S. Cl.
CPC ........ *B23K 26/706* (2015.10); *B23K 26/0006* (2013.01); *B23K 26/066* (2015.10);
(Continued)

(58) Field of Classification Search
None
See application file for complete search history.

(56) References Cited

U.S. PATENT DOCUMENTS

| | | | |
|---|---|---|---|
| 6,683,277 B1* | 1/2004 | Millard | B23K 26/123 219/121.84 |
| 6,782,033 B2* | 8/2004 | Ozasa | H01S 3/025 372/108 |

(Continued)

FOREIGN PATENT DOCUMENTS

| | | |
|---|---|---|
| CN | 101402229 | 4/2009 |
| CN | 103153521 | 6/2013 |

(Continued)

OTHER PUBLICATIONS

Chinese Office Action dated Apr. 16, 2020 for Application No. 201710128531.2.

*Primary Examiner* — Joel G Horning
(74) *Attorney, Agent, or Firm* — F. Chau & Associates, LLC

(57) ABSTRACT

A laser etching apparatus includes a chamber, a laser port, a laser emitter, a particle grabber, and a revolving window module. The chamber is configured to receive a substrate. The laser port is disposed below the chamber in a downward direction. The laser emitter is configured to emit a laser to the substrate disposed within the chamber through the laser port. The particle grabber is disposed within the chamber and includes a body disposed over the laser port. An opening is formed through the body. The opening is configured to pass the laser therethrough. The revolving window module includes a revolving window and a driving part configured to drive the revolving window. The revolving window is disposed between the particle grabber and the laser port.

17 Claims, 6 Drawing Sheets

(51) Int. Cl.
- *B23K 26/14* (2014.01)
- *B23K 26/00* (2014.01)
- *B23K 26/073* (2006.01)
- *B23K 26/12* (2014.01)
- *B23K 26/16* (2006.01)
- *B23K 26/362* (2014.01)
- *H01L 51/00* (2006.01)
- *H01L 51/56* (2006.01)
- *B23K 101/40* (2006.01)
- *B23K 103/00* (2006.01)
- *B23K 101/34* (2006.01)

(52) U.S. Cl.
CPC ........ *B23K 26/0732* (2013.01); *B23K 26/127* (2013.01); *B23K 26/1464* (2013.01); *B23K 26/16* (2013.01); *B23K 26/352* (2015.10); *B23K 26/355* (2018.08); *B23K 26/359* (2015.10); *B23K 26/361* (2015.10); *B23K 26/362* (2013.01); *H01L 51/0017* (2013.01); *H01L 51/56* (2013.01); *B23K 2101/34* (2018.08); *B23K 2101/40* (2018.08); *B23K 2103/30* (2018.08)

(56) References Cited

U.S. PATENT DOCUMENTS

| | | | |
|---|---|---|---|
| 2008/0206464 A1* | 8/2008 | Kappeler | C23C 16/4581 427/255.394 |
| 2013/0143416 A1 | 6/2013 | Norval | |
| 2014/0044863 A1 | 2/2014 | Kim | |

FOREIGN PATENT DOCUMENTS

| | | |
|---|---|---|
| CN | 103572214 | 2/2014 |
| CN | 2021303766 | 4/2015 |
| CN | 105234561 | 1/2016 |
| FR | 2638993 | 11/1988 |
| JP | 1992-187763 | 7/1992 |
| JP | 1992-214862 | 8/1992 |
| JP | 1992-214864 | 8/1992 |
| JP | 1995-229843 | 8/1995 |
| JP | 1998-242072 | 9/1998 |
| KR | 10-1514208 | 4/2015 |
| KR | 10-2015-0062336 | 6/2015 |
| TW | 201318747 | 5/2013 |

* cited by examiner

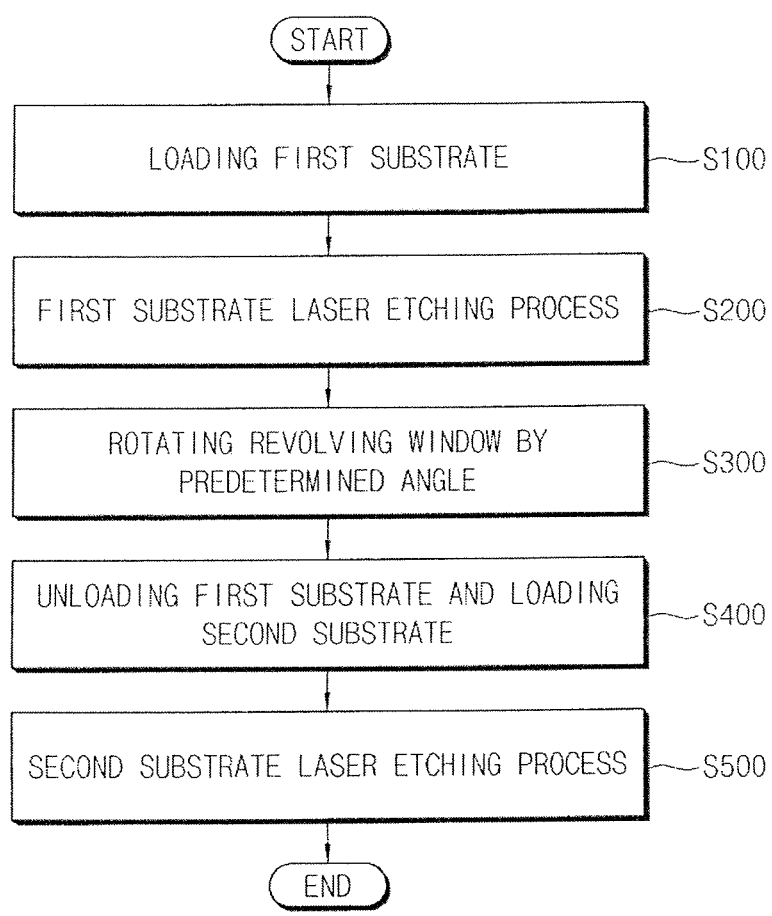

LASER ETCHING APPARATUS AND A METHOD OF LASER ETCHING USING THE SAME

CROSS-REFERENCE TO RELATED APPLICATIONS

This application claims priority to and the benefit of Korean Patent Application No. 10-2016-0047963 filed on Apr. 20, 2016, the disclosure of which is incorporated by reference herein in its entirety.

TECHNICAL FIELD

Exemplary embodiments of the inventive concept relate to a laser etching apparatus, and more particularly, to a laser etching apparatus and a method of laser etching using the laser etching apparatus.

DISCUSSION OF RELATED ART

Light weight and small display apparatuses have recently been produced. A cathode ray tube (CRT) display apparatus has traditionally been used. However, the CRT display apparatus has a large size and a heavy weight and therefore is not well situated for use in portable devices. Accordingly, smaller and lighter display devices have been developed. Examples of small and light display devices include a plasma display apparatus, a liquid crystal display apparatus, and an organic light-emitting display apparatus.

The organic-light emitting display apparatus includes the characteristics of fast response speed, lower power consumption than conventional liquid crystal displays (LCDs), light weight, not having a need for a back light assembly, and high brightness.

The organic light-emitting display apparatus includes an organic light-emitting element having a specific pattern disposed on a substrate. The pattern may be formed by forming an organic film on the substrate and pattering the organic film. Alternatively, the pattern may be formed by forming an organic pattern on the substrate using a mask. The organic film may be patterned by a laser etching apparatus. The laser etching apparatus may require substantial time and effort for maintenance and management. Therefore, a productivity of the process may decrease.

SUMMARY

Exemplary embodiments of the present invention provide a laser etching apparatus. The laser etching apparatus includes a chamber, a laser port, a laser emitter, a particle grabber, and a revolving window module. The chamber is configured to receive a substrate. The laser port is disposed below the chamber in a downward direction. The laser emitter is configured to emit a laser to the substrate disposed within the chamber through the laser port. The particle grabber is disposed within the chamber. The particle grabber includes a body disposed over the laser port. An opening is formed through the body. The opening is configured to pass the laser therethrough. The revolving window module includes a revolving window. The revolving window module further includes a driving part configured to drive the revolving window. The revolving window is disposed between the particle grabber and the laser port.

According to an exemplary embodiment of the present invention, the revolving window may have a circular shape. The revolving window may also rotate by a predetermined angle for each laser etching process performed for a predetermined number of substrates.

According to an exemplary embodiment of the present invention, the driving part may include a motor. The motor may be configured to rotate the revolving window. An atmospheric pressure space that may be separated from the chamber. The atmospheric pressure space may include an atmospheric pressure. The motor may be disposed within the atmospheric pressure space.

According to an exemplary embodiment of the present invention, the particle grabber may further include a slit shield. The slit shield may be disposed within the particle grabber. The slit shield may define a slit. The slit may extend in a first direction. The slit may have a width in a second direction substantially perpendicular to the first direction. The slit may also overlap the opening of the body.

According to an exemplary embodiment of the present invention, the particle grabber may further include a static electricity generator. The static electricity generator may be disposed within the body.

According to an exemplary embodiment of the present invention, the static electricity generator may include two surfaces. The two surfaces may face each other. The opening of the body may be disposed between the two surfaces.

According to an exemplary embodiment of the present invention, the laser etching apparatus may further include a nitrogen generator. The laser etching apparatus may also include an aspirator. The nitrogen generator and the aspirator may be disposed below the static electricity generator. The nitrogen generator may be configured to generate nitrogen at a lower portion of the particle grabber. The aspirator may be configured to suck the nitrogen.

According to an exemplary embodiment of the present invention, an axis of rotation of the revolving window might not to overlap the slit.

According to an exemplary embodiment of the present invention, the axis of rotation may be spaced apart from the slit in the first direction.

According to an exemplary embodiment of the present invention, the revolving window may rotate by a predetermined angle.

According to an exemplary embodiment of the present invention, the revolving window may rotate by about 1° for each substrate being laser etched. The slit may be about 30 mm in the first direction. The slit may be about 9 mm in the second direction. The revolving window may have a diameter of about 150 mm. The revolving window may be spaced apart from a lower surface of the body by about 12 mm.

Exemplary embodiments of the present invention provide a method of laser etching using a laser etching apparatus. The laser etching apparatus includes a chamber, a laser port, a laser emitter, a particle grabber, and a revolving window module. The laser port may be dispose d below the chamber in a downward direction. The particle grabber includes a body disposed over the laser port and having an opening. The revolving window module includes a revolving window. The revolving window is disposed between the particle grabber and the laser port. The revolving window module further includes a driving part. The driving part is configured to drive the revolving window. The method includes loading a first substrate having a first organic film disposed thereon into the chamber. A first substrate laser etching process is performed. The first organic film disposed on the first substrate is etched by the laser. The revolving window is rotated by a predetermined angle to locate an unpolluted portion of the revolving window disposed between the laser emitter and the particle grabber. The first substrate is unloaded from the chamber. A second substrate having a second organic film disposed thereon is loaded into the chamber. A second substrate laser etching process is performed. The second organic film disposed on the second substrate is etched by the laser.

According to an exemplary embodiment of the present invention, the revolving window may have a circular shape. The driving part may rotate the revolving window by a predetermined angle for each laser etching process performed for a predetermined number of substrates.

According to an exemplary embodiment of the present invention, the driving part may include a motor. The motor may be configured to rotate the revolving window and an atmospheric pressure space. The atmospheric pressure space may be separated from the chamber. The atmospheric pressure space may have an atmospheric pressure. The motor may be disposed within the atmospheric pressure space.

According to an exemplary embodiment of the present invention, the particle grabber may further include a slit shield. The slit shield may be disposed within the particle grabber. The slit shield may define a slit. The slit may extend in a first direction. The slit may have a width in a second direction substantially perpendicular to the first direction. The slit may also overlap the opening of the body.

According to an exemplary embodiment of the present invention, the particle grabber may further include a static electricity generator. The static electricity generator may be disposed within the body.

According to an exemplary embodiment of the present invention, the laser etching apparatus may further include a nitrogen generator. The laser etching apparatus may also include an aspirator. The nitrogen generator and the aspirator may be disposed below the static electricity generator. The nitrogen generator may be configured to generate nitrogen at a lower portion of the particle grabber. The aspirator may be configured to suck the nitrogen.

According to an exemplary embodiment of the present invention, an axis of rotation of the revolving window might not overlap the slit.

According to an exemplary embodiment of the present invention, the revolving window may rotate by about 1° for each substrate being laser etched. The slit may be about 30 mm in the first direction. The slit may be about 9 mm in the second direction. The revolving window may have a diameter of about 150 mm. The revolving window may be spaced apart from a lower surface of the body by about 12 mm.

According to an exemplary embodiment of the present invention, the method may further include cleaning the revolving window when the revolving window rotates about 360°.

BRIEF DESCRIPTION OF THE DRAWINGS

These and/or other aspects will become more apparent and more readily appreciated from the following description of the exemplary embodiments of the present invention, taken in conjunction with the accompanying drawings, in which:

FIG. 6 is a flowchart illustrating a method of laser etching according to an exemplary embodiment of the present invention.

DETAILED DESCRIPTION OF THE EMBODIMENTS

Figure 1:
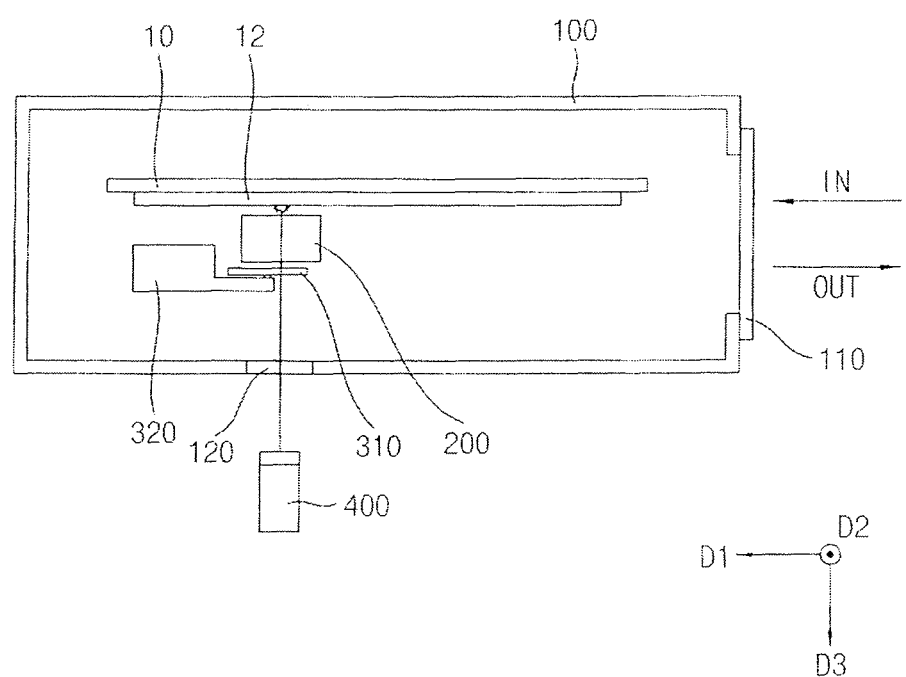
FIG. 1 is a cross-sectional view illustrating a laser etching apparatus according to an exemplary embodiment of the present invention.

Exemplary embodiments of the present invention may include different forms and embodiments and should not be construed as being limited to the descriptions set forth herein. Accordingly, the exemplary embodiments of the present invention are described below, by referring to the figures, to explain aspects of the present inventive concept. It will be understood that when a layer, region or component is referred to as being "formed on" or "disposed on" another layer, region, or component, it can be directly or indirectly formed or disposed on the other layer, region or component. Therefore, intervening layers, regions, or components may be present.

Reference will now be made in detail to exemplary embodiments of the present invention, examples of which are illustrated in the accompanying drawings, wherein like reference numerals may refer to like elements throughout. Sizes of elements in the drawings may be exaggerated for convenience of explanation.

FIG. 1 is a cross-sectional view illustrating a laser etching apparatus according to an exemplary embodiment of the present invention.

The laser etching apparatus may be used for patterning of an organic thin film. The organic thin film may form an organic light-emitting element.

The organic light-emitting element may be formed by sequentially stacking an anode, a hole injection layer, a hole transfer layer, an emitting layer, a hole blocking layer, an electron transfer layer, an electron injection layer, and a cathode on a substrate.

The organic thin film may have a multi-layered structure. The multi-layered structure may include the hole injection layer, the hole transfer layer, the emitting layer, the hole blocking layer, the electron transfer layer, and the electron injection layer. The electron injection layer may increase emitting efficiency. The emitting layer may include an organic material. The organic material may include Tris(8-hydroxyquinolato)aluminum (Alq3), N,N'-Bis(3-methylphenyl)-N,N'-diphenylbenzidine (TPD), pyrrolobenzodiazepine (PBD), 4,4',4"-Tris[(3-methylphenyl)phenylamino]triphenylamine (m-MTDATA), or Tris(4-carbazoyl-9-ylphenyl)amine (TCTA); however, exemplary embodiments of the present invention are not limited thereto.

The organic light-emitting element may include the anode, the cathode, and the emitting layer. The emitting layer may be disposed between the anode and the cathode. When the organic light-emitting element is driven, holes may be injected into the emitting layer from the anode. Electrons may be injected into the emitting layer from the cathode. The holes and the electrons injected in the emitting layer may combine and generate excitons. The excitons may be generated by the hole and the electron combining within the emitting layer. The excitons may relax from an excited state to a ground state to emit light.

The organic light-emitting element may include single color type according to a color of emitted light. Alternatively, the organic light-emitting element may include a full color type according to the color of emitted light. The full color type organic light-emitting element may be implemented by a red emitting layer, a green emitting layer, and a blue emitting layer. The red emitting layer, the green emitting layer, and the blue emitting layer may be separately patterned. A process of patterning the red, green, and blue emitting layers may be variously performed according to a material of the red, green, and blue emitting layers.

According to an exemplary embodiment of the present invention, an organic film 12 may be formed on a base substrate 10. A red emitting pattern may be formed by patterning the organic film 12. The red emitting pattern may correspond to a red sub pixel. An organic film may then be formed on the base substrate 10. A green emitting pattern may be formed by patterning the organic film. The green emitting pattern may correspond to a green sub-pixel. A blue emitting pattern may be formed by patterning the organic film. The blue emitting pattern may correspond to a blue sub-pixel. Furthermore, the red emitting pattern, the green emitting pattern, and the blue emitting pattern may be formed by respectively laser etching a preliminary red emitting pattern, a preliminary green emitting pattern, and a preliminary blue emitting pattern. The preliminary red emitting pattern, the preliminary green emitting pattern, and the preliminary blue emitting pattern may be formed on the substrate 10 by using a mask.

A sealing substrate may be formed at an edge of the base substrate 10. A sealing element may also be formed at the edge of the base substrate 10. A portion of the organic film at the edge of the base substrate 10 may be removed. Therefore, adhesiveness between the base substrate 10 and the sealing substrate may be increased.

Therefore, the organic film may be patterned after forming the organic film. The organic film may be patterned by a laser etching apparatus.

When a laser etching method using the laser etching apparatus is performed, organic particles from the organic film may contaminate the laser etching apparatus. Therefore, a productivity of the process may decrease. A chamber of the laser etching apparatus may be periodically cleaned to increase a productivity of the process. Accordingly, maintenance of the laser etching apparatus might not be efficient.

According to a laser etching apparatus and a method of laser etching using the laser etching apparatus according to an exemplary embodiment of the present invention, a revolving window 310 on which the organic particles are attached may rotate. Therefore, additional cleaning of a chamber of the laser etching apparatus might not be needed. Therefore, a productivity of the process may be increased.

The laser etching apparatus may include a chamber 100, a particle grabber 200, a revolving window module, and a laser emitter 400. The revolving window module may include a revolving window 310. The revolving window module may also include a driving part 320.

The driving part 320 may be configured and serve to rotate the revolving window 310.

The chamber 100 may provide a space for an etching process of a substrate 10. The chamber 100 may be a vacuum chamber. The space in the chamber 100 may maintain a vacuum when a portion of the organic film is removed to pattern the organic film 12 disposed on the substrate 10 by a laser etching process. To maintain proper vacuum pressure, a vacuum pump may be provided at a side of the chamber 100. A gate for the substrate 10 may be formed at a sidewall of the chamber 100. A gate door 110 may be formed at the gate. The gate door 110 may be configured and serve to open and close the gate.

The substrate 10 may be loaded into or unloaded from the chamber 100 through the gate of the chamber 100 by a chucking module. The chucking module may be an ES chuck using an electrostatic force to grip the substrate 10. The substrate 10 may be disposed on the organic film 12 in a third direction D3. The substrate 10 may be disposed in a plane of a first direction D1 and a second direction D2, which are substantially perpendicular to the third direction D3. The second direction D2 may be substantially perpendicular to the first direction D1.

A laser port 120 may be disposed below the chamber 100. The laser port 120 may be transparent. Therefore, a laser beam from the laser emitter 400 may pass through the laser port 120.

The particle grabber 200 may be disposed within the chamber 100. The particle grabber 200 may be disposed over the laser port 120 of the chamber 100. Therefore, the particle grabber 200 may be disposed between the substrate 10 which is loaded in the chamber 100 and the laser port 120. The particle grabber 200 may be configured and serve to grab organic particles formed from the organic film 12. The particle grabber 200 will be described in detail below with reference to FIGS. 2 to 5.

The laser emitter 400 may be disposed below the chamber 100. Therefore, the laser emitter 400 may be disposed below the laser port 120. The laser emitter 400 may also be spaced apart from the laser port 120 in the third direction D3. The laser emitter 400 may emit a laser to pattern the organic film 12 disposed on the substrate 10. According to an exemplary embodiment of the present invention, the laser emitter 400 may be disposed outside of the chamber 100. The laser emitter 400 disposed outside of the chamber 100 may emit the laser into the chamber 100. The laser emitter 400 may emit the laser through the laser port 120 of the chamber 100. Therefore, the laser may reach the organic film 12 disposed on the substrate 10.

The laser emitter 400 may emit the laser substantially parallel to the third direction D3. According to an exemplary embodiment of the present invention, although the laser may be substantially parallel to the third direction D3, the laser may alternatively be inclined with respect to the third direction D3.

When the organic film 12 is etched by the laser, a large amount of organic particles may be formed and may be scattered from the organic film 12. Furthermore, the organic particles may fall by gravity. Accordingly, the organic particles may fall in the third direction D3. The organic particles may be collected by the particle grabber 200. The organic particles may also be attached on the revolving window 310. Therefore, adhesion of the organic particles on the laser port 120 may be prevented. Accordingly, a degradation of laser emitting efficiency due to the organic particles may be decreased. Additionally, the revolving window 310 may be automatically rotated by the driving part 320. Therefore, maintenance efficiency of the laser etching apparatus may be increased. Thus, productivity of the method may be increased.

Figure 2:
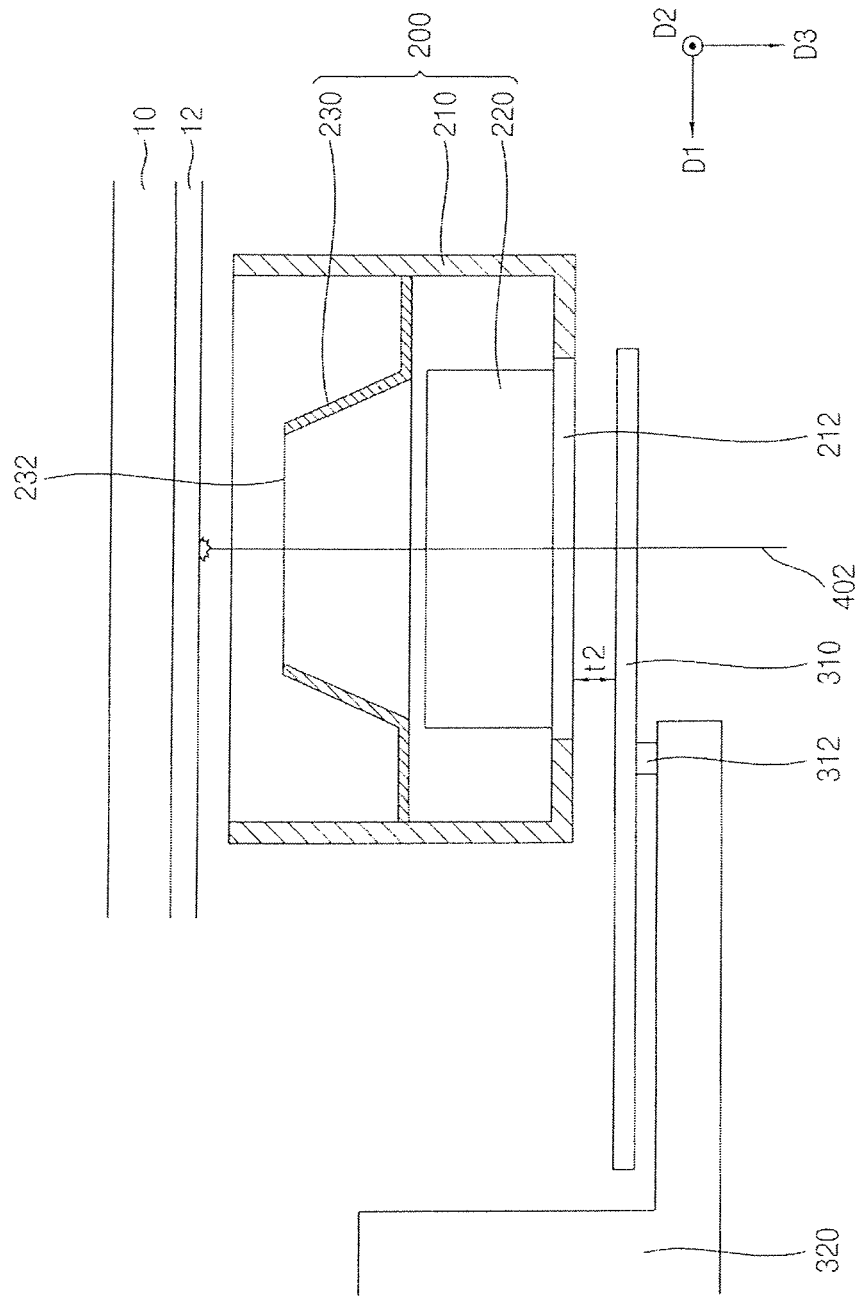
FIG. 2 is a cross-sectional view taken along a surface perpendicular to a second direction illustrating a particle grabber of a laser etching apparatus of FIG. 1 according to an exemplary embodiment of the present invention.
Figure 3:
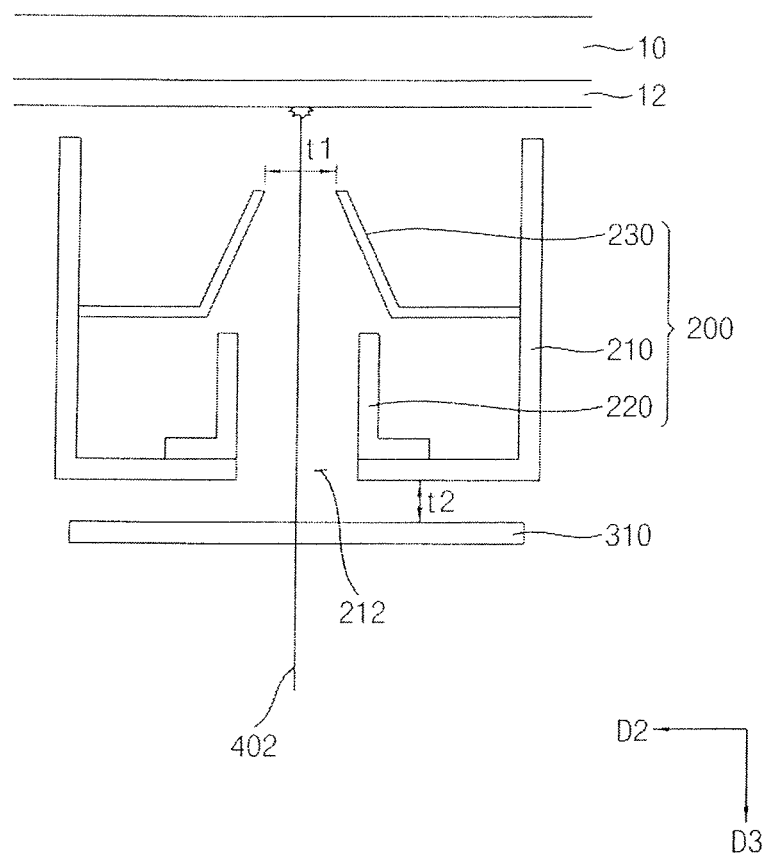
FIG. 3 is a cross-sectional view taken along a surface perpendicular to a first direction illustrating a particle grabber of a laser etching apparatus of FIG. 1 according to an exemplary embodiment of the present invention.

FIG. 2 is a cross-sectional view taken along a surface substantially perpendicular to a second direction illustrating a particle grabber of a laser etching apparatus of FIG. 1 according to an exemplary embodiment of the present invention. FIG. 3 is a cross-sectional view taken along a surface substantially perpendicular to a first direction illustrating a particle grabber of a laser etching apparatus of FIG. 1 according to an exemplary embodiment of the present invention.

Referring to FIGS. 2 and 3, the particle grabber 200 may include a body 210, a slit shield 230, and a static electricity generator 220. The body 210 may have a cylindrical shape. The slit shield 230 may be disposed in the body 210.

The slit shield 230 may define a slit 232. The slit 232 may extend in the first direction D1. The slit 232 may have a width t1 in the second direction D2. The slit shield 230 may have a slanted surface. The slanted surface may be near the slit 232. The slit shield 230 may be configured and serve to collect the organic particles which may be scattered.

The slit 232 may have a length in the first direction D1. The slit 232 may have the width t1 in the second direction D2. The width t1 of the slit 232 may be about 9 mm. The length of the slit 232 may be about 30 mm.

The static electricity generator 220 may be disposed within the body 210. The static electricity generator 220 may also be disposed under the slit shield 230. The static electricity generator 220 may be configured to generate static electricity. The static electricity generator 220 may also be used to collect the organic particles which may be scattered.

An opening 212 may be formed at a lower portion of the body 210. A laser emitted from the laser emitter 400 may pass through the opening 212.

The particle grabber 200 may include a nitrogen generator. The particle grabber 200 may also include an aspirator. The nitrogen generator and the aspirator may be disposed between the static electricity generator 220 and the revolving window 310. The aspirator may be configured to collect the organic particles which may be scattered near the slit shield 230 and the particle grabber 200. The nitrogen generator may be configured to generate nitrogen at a portion of the chamber 100. The aspirator may be configured to suck the nitrogen generated by the nitrogen generator. A vacuum may be disposed within the chamber 100. The organic particles with the nitrogen may be sucked by the aspirator. Accordingly, the organic particles may thereby be collected.

The particle grabber 200 may be connected to a cooling part. The particle grabber 200 may be cooled by the cooling part. Therefore, the particle grabber 200 cooled by the cooling part may collect the organic particles.

The revolving window module may include the revolving window 310, an axis of rotation 312 of the revolving window 310, and a driving part 320. The driving part 320 may be configured and serve to rotate the revolving window 310.

The revolving window 310 may be spaced apart from a bottom surface of the particle grabber 200 in the third direction D3 by a gap t2. The gap t2 may be about 12 mm.

The revolving window 310 may have a circular disk shape. The revolving window 310 may include a transparent material. The transparent material may be configured to pass laser light 402 form the laser emitter 400. For example, the revolving window 310 may include glass.

The axis of rotation 312 of the revolving window 310 may be disposed so as not to overlap with the opening 212 of the body 210 of the particle grabber 200. Therefore, as illustrated in FIG. 4, the axis of rotation 312 may be spaced apart from the opening 212 in the first direction D1 in a plan view.

The driving part 320 may include a motor and a power transfer means. The power transfer means may be a gear or a belt which is configured to transfer a turning force of the motor to the revolving window 310. The motor and the power transfer mean of the driving part 320 may be disposed within the chamber 100. Therefore, the motor and the power transfer means may be disposed in an atmospheric pressure space having atmospheric pressure. Accordingly, an influx of the organic particles formed during the laser etching process may be decreased. Additionally, a degradation factor of the motor such as plasma discharge in the vacuum may be reduced.

Figure 4:
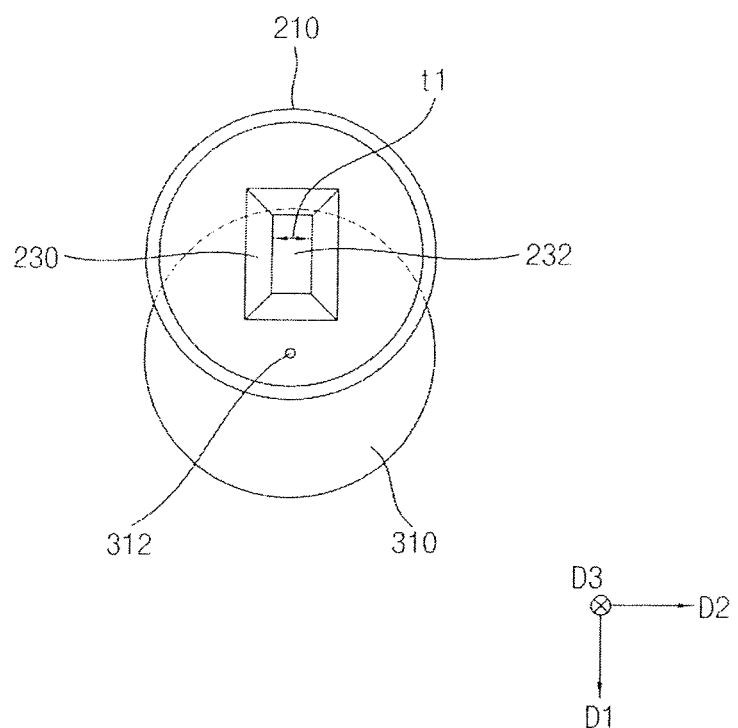
FIG. 4 is a plan view illustrating a revolving window and a particle grabber of a laser etching apparatus of FIG. 1 according to an exemplary embodiment of the present invention.
Figure 5:
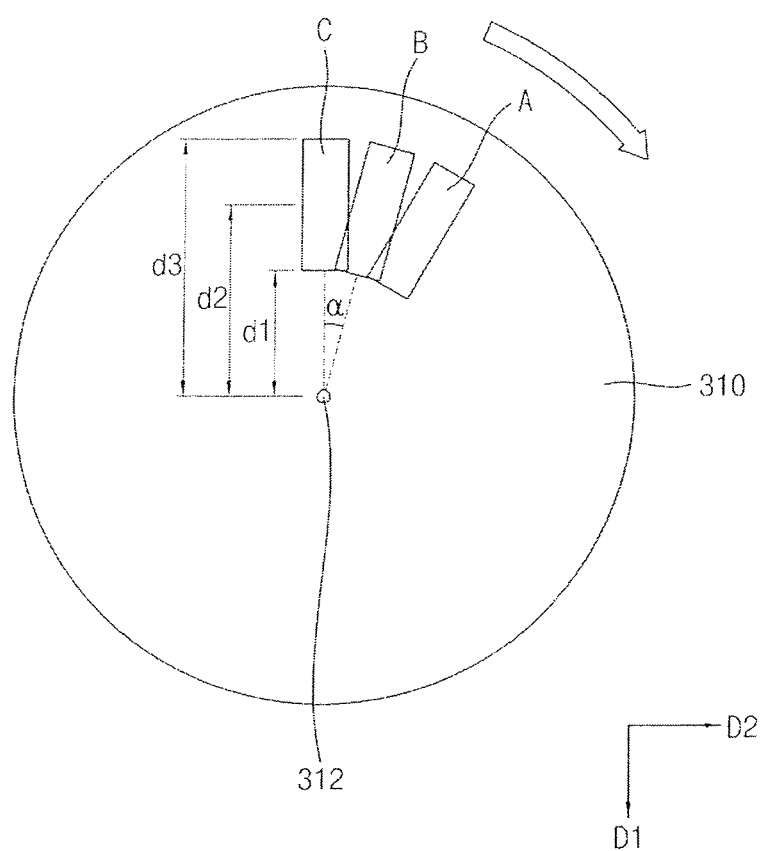
FIG. 5 is a plan view illustrating an operation of the revolving window of a laser etching apparatus of FIG. 1 according to an exemplary embodiment of the present invention.

FIG. 4 is a plan view illustrating a revolving window and a particle grabber of a laser etching apparatus of FIG. 1 according to an exemplary embodiment of the present invention. FIG. 5 is a plan view illustrating an operation of a revolving window of a laser etching apparatus of FIG. 1 according to an exemplary embodiment of the present invention.

Referring to FIGS. 4 and 5, a slit shield 230 may define a slit 232. The slit 232 may extend in the first direction D1. The slit 232 may have a width t1 in the second direction D2. The slit shield 230 may include a slanted surface. The slanted surface may be near the slit 232. The revolving window 310 may be disposed below the body 210 of the particle grabber 200. The axis of rotation 312 of the revolving window 310 may be disposed so as to not overlap the slit 232. The axis of rotation 312 of the revolving window 310 may also be spaced apart from the slit 232 in the first direction D1. The width t1 may be about 9 mm. The length may be about 30 mm.

As the revolving window 310 is rotated, a first area A, a second area B, and a third area C may be sequentially polluted by the organic particles. Each of the first area A, the second area B and the third area C may have substantially the same size as the slit 232. A distance between the particle grabber 200 and the revolving window 310 may be close enough so that the organic particles fall through the slit 232 in the third direction D3. Therefore, the organic particles may pollute an area of the revolving window 310 which has a size substantially the same as the size of the slit 232. According to an exemplary embodiment of the present invention, the revolving window 310 may rotate by predetermined angle α for every one substrate being laser etched. Accordingly, a portion of the revolving window 310 where the laser light passes through may be maintained in a clean condition.

For example, when the slit 232 has about 9 mm width and about 30 mm length, each of the first area A, the second area B and the third area C may have about 9 mm width and about 30 mm length. When the revolving window 310 has about 150 mm diameter, a first length d1 is about 40 mm, a second length d2 is about 55 mm, and a third length d3 is about 70 mm. The revolving window 310 may rotate about 1° for each substrate being laser etched.

When the revolving window 310 is substantially completely contaminated, the revolving window 310 may be cleaned. For example, when the revolving window 310 rotates about 360°, then the revolving window 310 may be cleaned.

FIG. 6 is a flowchart illustrating a method of laser etching according to an exemplary embodiment of the present invention.

Referring to FIG. 6, the method of laser etching may include loading a first substrate S100, performing a first substrate laser etching process S200, rotating the revolving window by a predetermined angle S300, unloading the first substrate and loading a second substrate S400, and performing a second substrate laser etching process S500.

In loading a first substrate S100, a first substrate on which an organic film is formed may be loaded in a chamber of a laser etching apparatus. The laser etching apparatus may include the chamber, a laser emitter, a particle grabber, and a revolving window module. A laser port may be formed below the chamber in a downward direction. The laser emitter may generate laser light. The laser light may etch the organic film. The particle grabber may include a body.

The body may be disposed over the laser port. An opening may be formed through the body. The revolving window module may include a revolving window. The revolving window may be disposed between the laser port and the particle grabber. The revolving window module may further include a driving part. The driving part may be configured to rotate the revolving window.

In the first substrate laser etching process S200, the organic film disposed on the first substrate may be etched by a laser from the laser emitter through the laser port.

In rotating the revolving window by a predetermined angle S300, the revolving window which may be contaminated by organic particles formed from the organic film in step S200 may be rotated. Therefore, an unpolluted portion of the revolving window may be located between the laser emitter and the particle grabber. For example, the revolving window may be rotated by the predetermined angle whenever a laser etching process for a predetermined number of substrates is performed.

In rotating the revolving window by a predetermined angle S400, the first substrate in which the patterning process has been completed may be unloaded from the chamber. A second substrate which may include an organic film may be loaded into the chamber.

According to exemplary embodiments of the present invention, although the step S400 may be performed after the step S300, the step S400 may be performed at substantially the same time as the step S300 or before the step S300.

In the second substrate laser etching process S500, the organic film disposed on the second substrate may be etched by emitting a laser from the laser emitter through the laser port.

In the laser etching process S200 and S300, organic particles formed form the organic film may be collected by the particle grabber. The organic particles which fall through the opening may be collected by the revolving window module.

When the revolving window is substantially completely contaminated, the revolving window may be cleaned. For example, when the revolving window rotates about 360°, the revolving window may be cleaned.

According to the laser etching apparatus and the method of laser etching according to an exemplary embodiment of the present invention, organic particles formed during a process may be collected by the particle grabber and the revolving window. The revolving window may rotate when the revolving window is contaminated by the organic particles. Therefore, an unpolluted portion of the revolving window may correspond to the laser emitter. Accordingly, maintenance efficiency of the laser etching apparatus may be increased. Thus, a productivity of the process may be increased.

The foregoing is illustrative of the present invention and is not to be construed as limiting thereof. Although several exemplary embodiments of the present invention have been described, those skilled in the art will readily appreciate that many modifications are possible in the exemplary embodiments of the present invention.

What is claimed is:

1. A laser etching apparatus, comprising:
   a vacuum chamber configured to receive a substrate;
   a laser port formed at a bottom of the vacuum chamber;
   a laser emitter configured to emit a laser to the substrate disposed within the vacuum chamber through the laser port, and disposed under the vacuum chamber;
   a window module comprising a window, wherein the window is disposed between substrate and the laser port, and disposed in the vacuum chamber; and
   a particle grabber disposed between the window and the substrate within the vacuum chamber,
   wherein the particle grabber comprises a static electricity generator.

2. The laser etching apparatus of claim 1, wherein the window module further includes a driving part configured to drive the window,
   wherein the window has a circular shape and rotates by a predetermined angle for each laser etching process performed for a predetermined number of substrates.

3. The laser etching apparatus of claim 2, wherein the driving part comprises a motor configured to rotate the window and an atmospheric pressure space that is separated from the vacuum chamber, the atmospheric pressure space having an atmospheric pressure, and wherein the motor is disposed within the atmospheric pressure space.

4. The laser etching apparatus of claim 1,
   wherein the particle grabber is configured to collect organic particles, the particle grabber including a body disposed over the laser port, wherein an opening is formed through the body and the opening is configured to pass the laser therethrough,
   wherein the particle grabber further comprises a slit shield disposed within the particle grabber, and
   wherein the slit shield defines a slit, the slit extends in a first direction, has a width in a second direction substantially perpendicular to the first direction, and overlaps the opening of the body.

5. The laser etching apparatus of claim 4, wherein the window module further includes a driving part configured to rotate die window, and
   wherein an axis of rotation of the window does not overlap the slit.

6. The laser etching apparatus of claim 5, wherein the axis of rotation is spaced apart from the slit in the first direction.

7. The laser etching apparatus of claim 5, wherein the window rotates by a predetermined angle.

8. The laser etching apparatus of claim 7, wherein the window rotates by about 1° for each substrate being laser etched,
   wherein the slit is about 30 mm in the first direction, and about 9 mm in the second direction, and
   wherein the window has a diameter of about 150 mm, and is spaced apart from a lower surface of the body by about 12 mm.

9. The laser etching apparatus of claim 1, wherein the substrate includes an organic film thereon, and
   a space in the chamber maintains a vacuum when a portion of the organic film is removed to pattern the organic film by the laser.

10. The laser etching apparatus of claim 1, wherein the substrate includes an organic film thereon, and a portion of a light-entitling layer of an organic light-emitting element is etched by the laser emitted by the laser emitter.

11. The laser etching apparatus of claim 1, wherein the particle grabber further comprises a nitrogen generator configured to generate nitrogen and an aspirator configured to suck the nitrogen.

12. A laser etching apparatus, comprising:
a vacuum chamber configured to receive a substrate;
a laser port formed at a bottom of the vacuum chamber;
a laser emitter configured to emit a laser to the substrate disposed within the vacuum chamber through the laser port, and disposed under the vacuum chamber;
a window module comprising a window, wherein the window is disposed between the substrate and the laser port, and disposed in the vacuum chamber; and
a particle grabber disposed within the vacuum chamber, the particle grabber including a body disposed over the laser port, wherein an opening is formed through the body and the opening is configured to pass the laser therethrough,
wherein the particle grabber further comprises a slit shield disposed within the particle grabber,
wherein the slit shield defines a slit, the slit extends in a first direction, has a width in a second direction substantially perpendicular to the first direction, and overlaps the opening of the body, and
wherein the particle grabber further comp ices a static electricity generator disposed within the body.

13. The laser etching apparatus of claim 12, wherein the static electricity generator comprises two surfaces facing each other, and wherein the opening of the body is disposed between the two surfaces.

14. The laser etching apparatus of claim 13, further comprising:
a nitrogen generator and an aspirator disposed below the static electricity generator,
wherein the nitrogen generator is configured to generate nitrogen at a lower portion of the particle grabber, and the aspirator is configured to suck the nitrogen.

15. A laser etching apparatus, comprising:
a vacuum chamber configured to receive a substrate;
a laser port formed at a bottom of the vacuum chamber;
a laser emitter configured to emit a laser to the substrate disposed within the vacuum chamber through the laser port, and disposed under the vacuum chamber;
a window module comprising a window, wherein the window is disposed between the substrate and the laser port, and disposed in the vacuum chamber; and
a particle grabber disposed between the window and the substrate within the vacuum chamber,
wherein a portion of tyre window includes organic particles attached thereto,
wherein the window is configured to rotate the portion of the window that includes organic particles out of a route of the laser, and
wherein the particle grabber comprises a static electricity generator.

16. The laser etching apparatus of claim 15, wherein the substrate includes an organic film thereon, and
a space in the chamber maintains a vacuum when a portion of the organic film is removed to pattern the organic film by the laser.

17. The laser etching apparatus of claim 15, wherein the particle grabber comprises a nitrogen generator configured to generate nitrogen and an aspirator configured to suck the nitrogen.

* * * * *